United States Patent
Liu

(10) Patent No.: US 8,547,757 B2
(45) Date of Patent: Oct. 1, 2013

(54) PROGRAMMABLE KEEPER FOR SEMICONDUCTOR MEMORIES

(75) Inventor: Jack Liu, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 116 days.

(21) Appl. No.: 13/192,660

(22) Filed: Jul. 28, 2011

(65) Prior Publication Data

US 2013/0028030 A1  Jan. 31, 2013

(51) Int. Cl.
*G11C 7/00* (2006.01)

(52) U.S. Cl.
USPC .................................................. 365/189.011

(58) Field of Classification Search
None
See application file for complete search history.

(56) References Cited

U.S. PATENT DOCUMENTS

| 6,591,402 B1 * | 7/2003 | Chandra et al. ............... 716/106 |
| 2004/0189347 A1 * | 9/2004 | Hsu et al. ........................ 326/121 |

* cited by examiner

*Primary Examiner* — Huan Hoang
*Assistant Examiner* — James G Norman
(74) *Attorney, Agent, or Firm* — Duane Morris LLP

(57) ABSTRACT

A method includes receiving a memory code identifying a number of logic zeroes and logic ones to be stored in a semiconductor memory, determining a number of bit cells of a first type that are to be coupled to a first bit line of the semiconductor memory from the memory code, and selecting a first keeper circuit from a plurality of keeper circuits based on the number of bit cells of the first type that are to be coupled to the first bit line. An electronic representation of a layout of the semiconductor memory is stored in a non-volatile machine readable storage medium.

19 Claims, 4 Drawing Sheets

PROGRAMMABLE KEEPER FOR SEMICONDUCTOR MEMORIES

FIELD OF DISCLOSURE

The disclosed system and method relate to semiconductor memories. More specifically, the disclosed system and method relate to programmable keepers for semiconductor memories.

BACKGROUND

Semiconductor memories, such as random access memories ("RAMs") and read only memories ("ROMs"), may include a keeper circuit coupled to a bit line to reduce leakage current and to reduce noise from corrupting data being read out of a memory bit cell coupled to the bit line. However, these conventional keeper circuits may still suffer from having high DC leakage currents, especially during low voltage operation, and result in the semiconductor memory having a slow operating time. Also, such conventional keepers are designed for worst-case coding, which can limit VCCmin operation and further increase power consumption.

DETAILED DESCRIPTION

The disclosed semiconductor memories and methods of designing and fabricating the semiconductor memories advantageously provide keeper circuits having sizes that are optimized to the types of bit cells, e.g., bit cells that output logic one or logic zeroes during a read operation, coupled to a particular bit line. Optimizing the keeper circuits to the types of bit cells coupled to the bit line can reduce power consumption of the semiconductor memory while at the same time improve the operating speed and low power, VCCmin, operation of the semiconductor memory.

Figure 1:
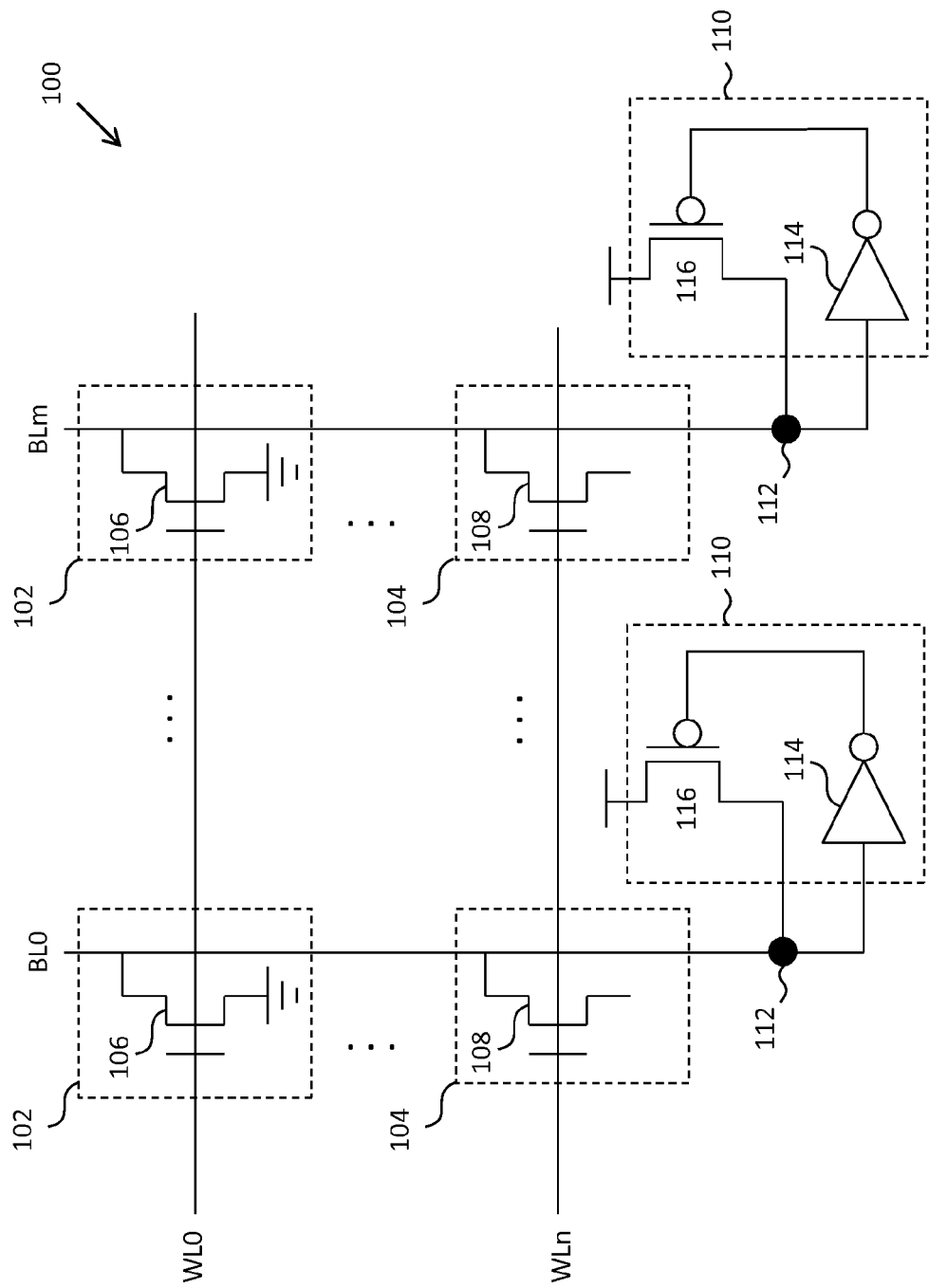
FIG. 1 is a circuit diagram of one example of an improved ROM array.

FIG. 1 illustrates one example of an improved read only memory ("ROM") array 100 including a plurality of programmed zero bit cells 102 (i.e., bit cells configured to output a logic zero during a read operation) and a plurality of programmed one bit cells 104 (i.e., bit cells configured to output a logic one when read). Bit cells 102 and 104 are arranged in a number, n, of rows and a number, m, of columns. Each bit cell 102, 104 in a row is coupled to a word line ("WL"), and each bit cell 102, 104 in a column is coupled to a bit line ("BL").

Programmed zero bit cells 102 may include a transistor 106 having its gate coupled to a WL, its drain coupled to a BL, and its source coupled to ground. Programmed one bit cells 104 may include the a transistor 108 having its gate coupled to a WL, its drain coupled to a BL, and its source may be unconnected or floating.

Each BL may be coupled to a respective keeper circuit 110 at a node 112. Keeper circuit 110 is configured to reduce leakage current and noise on the bit line to avoid data corruption. As shown in FIG. 1, keeper circuit 110 includes an inverter 114 and a transistor 116. Inverter 114 has its input coupled to the BL and its output is coupled to the gate of transistor 116. Transistor 116 has its source coupled to a high voltage supply line, e.g., VDD, and its drain is coupled to node 112.

When a logic zero is read from a programmed zero bit cell 102, the WL coupled to the gate of the programmed zero bit cell 102 is asserted to a high voltage to turn transistor 106 of bit cell 102 into a current-conducting 'on' state. Transistor 106 on results in the BL coupled to the drain of transistor 106 being coupled to ground (or VSS) through transistor 106, which pulls the BL from its precharged logic one state to a logic zero. The logic zero on the BL is inverted by inverter 114 coupled to the BL such that a logic one is output to the gate of transistor 116. Transistor 116 is in a non-current-conducting 'off' state when the voltage at its gate and source are high voltages.

When a logic one is read from a programmed one bit cell 104, the WL coupled to the gate of the programmed one bit cell 104 is asserted to a high. The BL, which is precharged to a logic one by precharge circuitry (not shown), remains at a logic one as the source of transistor 108 is unconnected from a voltage source such that charge does not have a path to flow to ground. The logic one on the BL is inverted by inverter 114 of keeper circuit 110 such that a logic zero is provided to the gate of transistor 116. Transistor 116 is turned into an on state due to the logic zero at its gate and the source being coupled to a high voltage supply line. With transistor 116 on, the high voltage supply line is coupled to node 112 through transistor 116 to maintain the bit line voltage at a logic one.

The inventors have discovered that by adjusting the strength of the keeper circuits 110, which in some instances may be the relative size of transistor 116, based on the number of programmed zero bit cells 102 and/or programmed one bit cells 104 that are coupled to a BL, the performance and power consumption of the semiconductor array 100 may be improved. Examples of such parameters include, but are not limited to, the length and/or width of the gate or channel of the transistor and/or the resistance of the transistor. For example, the size of the PMOS transistor 116 may inversely correspond to the number or size of programmed zero bit cells 102 that are coupled to a BL. A smaller PMOS transistor corresponds to a stronger keeper circuit 110 as will be understood by one skilled in the art. In contrast, the size of PMOS transistor 116, or number of PMOS transistors 116, may increase as the number of programmed one bit cells 104 increase to provide a weaker keeper circuit 110. For example, the size or number of PMOS transistors 116 in a keeper circuit 110 may be at a maximum when a BL includes only programmed one bit cells 104. One skilled in the art will understand that the size of keeper circuit 110 will vary based on the technology with which the semiconductor memory array is to be implemented.

Figure 2:
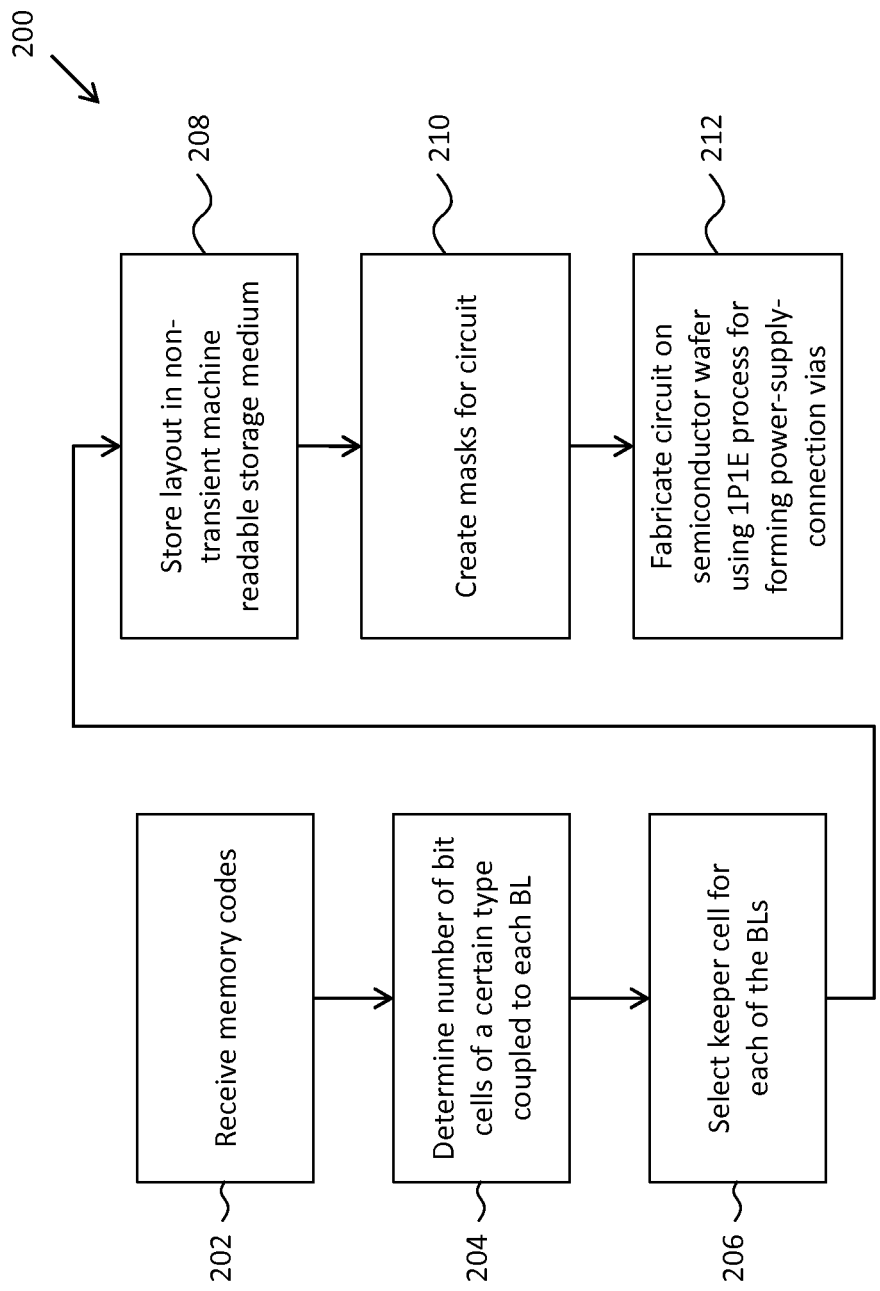
FIG. 2 is a flow diagram of one example of a method of designing and fabricating an improved ROM array in accordance with the ROM array in FIG. 1.

FIG. 2 is a flow diagram of one example of an improved method 200 of designing and fabricating a semiconductor memory array with optimized keeper circuits. Method 200 advantageously produces semiconductor memories having improved speed, VCCmin operation, and reduced leakage and power consumption.

Figure 3:
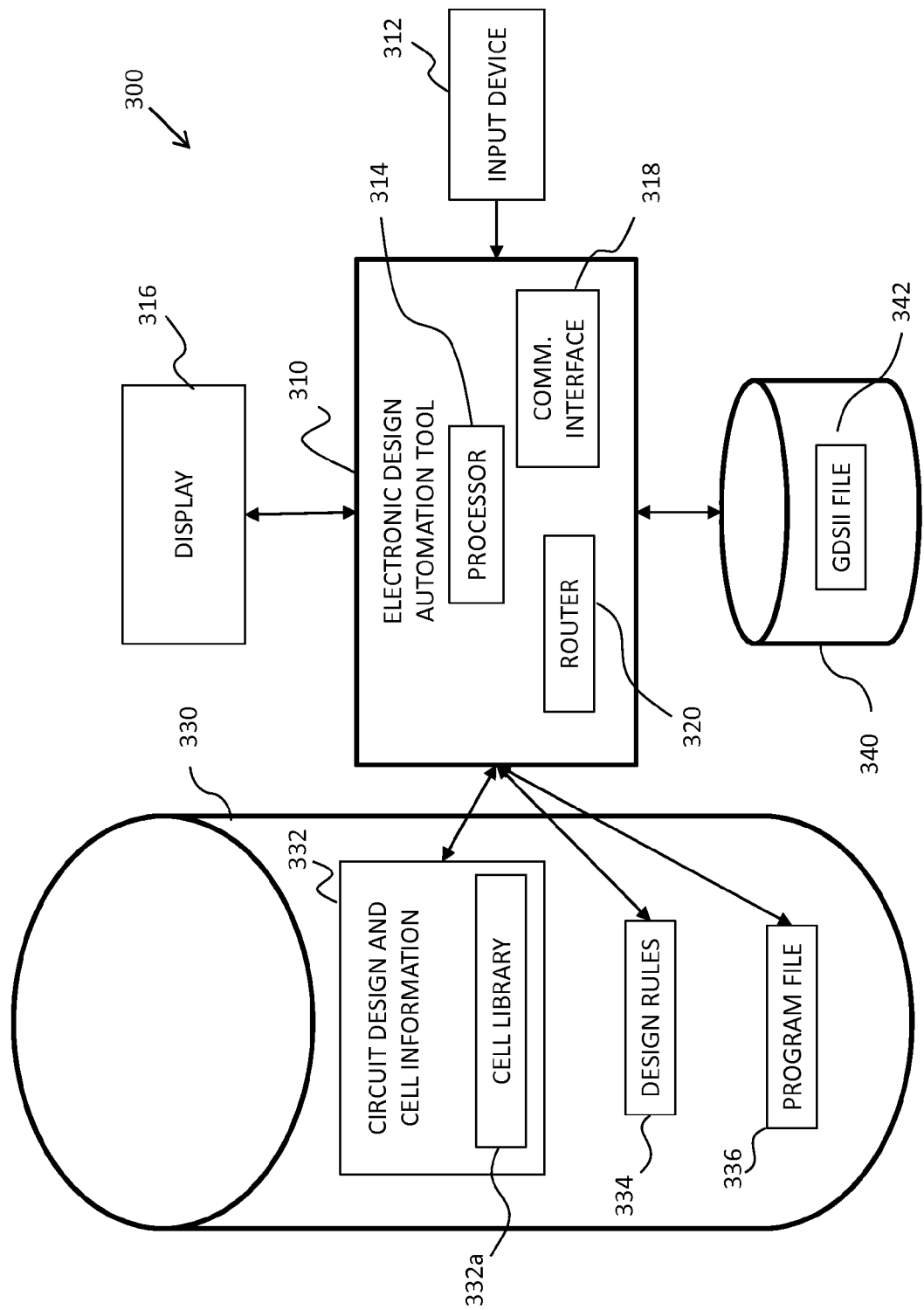
FIG. 3 is a block diagram of one example of a system for designing and fabricating an improved ROM array in accordance with FIG. 1.

Method 200 may be entirely or partially performed by a system, such as system 300 illustrated in FIG. 3. System 300 includes an electronic design automation ("EDA") tool 310 such as "IC COMPILER"™, sold by Synopsys, Inc. of Mountain View, Ca., having a router 320 such as "ZROUTE"™, also sold by Synopsys. Other EDA tools 310 may be used, such as, for example, the "VIRTUOSO" custom design platform or the Cadence "ENCOUNTER"® digital IC design platform along with the "VIRTUOSO" chip assembly router 320, all sold by Cadence Design Systems, Inc. of San Jose, Ca.

The EDA tool 310 is a special purpose computer formed by retrieving stored program instructions 336 from a non-transient machine or computer readable storage medium 330, 340 and executing the instructions on a general purpose processor 314. Processor 314 may be any central processing unit ("CPU"), microprocessor, micro-controller, or computational device or circuit for executing instructions. The non-transient machine readable storage medium 330, 340 may be a flash memory, random access memory ("RAM"), ROM, or other storage medium. Examples of RAMs include, but are not limited to, static RAM ("SRAM") and dynamic RAM ("DRAM"). ROMs include, but are not limited to, programmable ROM ("PROM"), electrically programmable ROM ("EPROM"), and electrically erasable programmable ROM ("EEPROM"), to name a few possibilities.

System 300 may include a display 316 and a user interface or input device 312 such as, for example, a mouse, a touch screen, a microphone, a trackball, a keyboard, or other device through which a user may input design and layout instructions to system 300. The one or more computer readable storage mediums 330, 340 may store data input by a user such as a circuit design and cell information 332, which may include a cell library 332a, design rules 334, one or more program files 336, and one or more graphical data system ("GDS") II files 342.

EDA tool 310 may also include a communication interface 318 allowing software and data to be transferred between EDA tool 310 and external devices. Examples of a communications interface 318 include, but are not limited to, a modem, an Ethernet card, a wireless network card, a Personal Computer Memory Card International Association ("PCMCIA") slot and card, or the like. Software and data transferred via communications interface 318 may be in the form of signals, which may be electronic, electromagnetic, optical, or the like that are capable of being received by communications interface 318. These signals may be provided to communications interface 318 via a communications path (e.g., a channel), which may be implemented using wire, cable, fiber optics, a telephone line, a cellular link, a radio frequency ("RF") link and other communication channels.

Router 320 is capable of receiving an identification of a plurality of cells to be included in a circuit layout, including a list 332 of pairs of cells, selected from the cell library 332a, within the plurality of cells to be connected to each other. Design rules 334 may be used for a variety of processing technologies (e.g., technology greater than, less than, or equal to 32 nm). In some embodiments, the design rules 334 configure the router 320 to locate connecting lines and vias on a manufacturing grid. Other embodiments may allow the router to include off-grid connecting lines and/or vias in the layout.

Referring again to FIG. 2, ROM or other memory codes are received at block 202. As will be understood by one skilled in the art, the memory codes identify a number of programmed zero bit cells 102 and programmed one bit cells 104 in a memory array 100 as well as the rows and columns in which the bit cells 102, 104 are to be located.

At block 204, the memory codes are analyzed to determine the number of programmed zero bit cells 102 and/or programmed one bit cells 104 that are to be located in each of the columns of the memory array 100. In some embodiments, for example, the memory codes may be analyzed to determine the number of programmed zero cells 102 that are to be coupled to each of the BLs. In some embodiments, the memory codes may be analyzed to determine the number of programmed one cells 104 that are to be coupled to each of the BLs.

At block 206, a keeper cell 110 is selected for each of the BLs. The keeper cells 110 may be selected from a plurality of keeper cells stored in cell library 332a based on the number of bit cells of the different types, e.g., programmed zero bit cells 102 and/or programmed one bit cells 104, are to be coupled to each BL. The keeper cells 110 may include a plurality of different keeper cells each optimized for a specific number of bit cell types coupled to a BL. One skilled in the art will understand that a number of cell libraries may exist for one or more processing technologies. In some embodiments, cell library 332a may include one keeper cell configured for a BL in which each of the bit cells coupled to the BL is a programmed zero bit cell 102, another keeper cell configured for a BL in which each of the bit cells coupled to the BL is a programmed one bit cell 104, and a plurality other keeper cells for each possible combination of programmed zero and programmed one bit cells being coupled to a BL.

The keeper cells stored in cell library 332a may be designed through iterative processes in which an initial keeper cell is selected for a first condition. For example, the initial keeper circuit cell may be designed for a BL in which each of the bit cells that are coupled to the BL are programmed zero bit cells for a specific processing technology (e.g., 32 nm, 28, nm, 22 nm, etc.). Simulations may be performed and the size and other characteristics of the keeper cell may be adjusted until the size of the keeper circuit for a BL in which each of the bit cells are programmed zero bit cells is optimized to provide a desired amount of leakage protection and operating speed. In some embodiments, the initial keeper circuit cell may be a keeper circuit cell for a BL in which each of the bit cells coupled to the bit cell are programmed one bit cell. An electronic representation of the optimized keeper cell may be stored in cell library 332a in a non-transient machine readable storage medium 330, 340.

A second keeper cell for a second condition for the first technology is also designed and optimized. The second condition may be for a BL in which each of the bit cells coupled to the BL are programmed one bit cells 104. Simulations may be performed and the size and other characteristics of the keeper circuit may be adjusted until the keeper circuit for a BL in which each of the bit cells are programmed one bit cells 104 is optimized to provide a desired amount of leakage protection and operating speed. An electronic representation of the optimized keeper cell may be stored in cell library 332a in a non-transient machine readable storage medium 330, 340.

Figure 4:
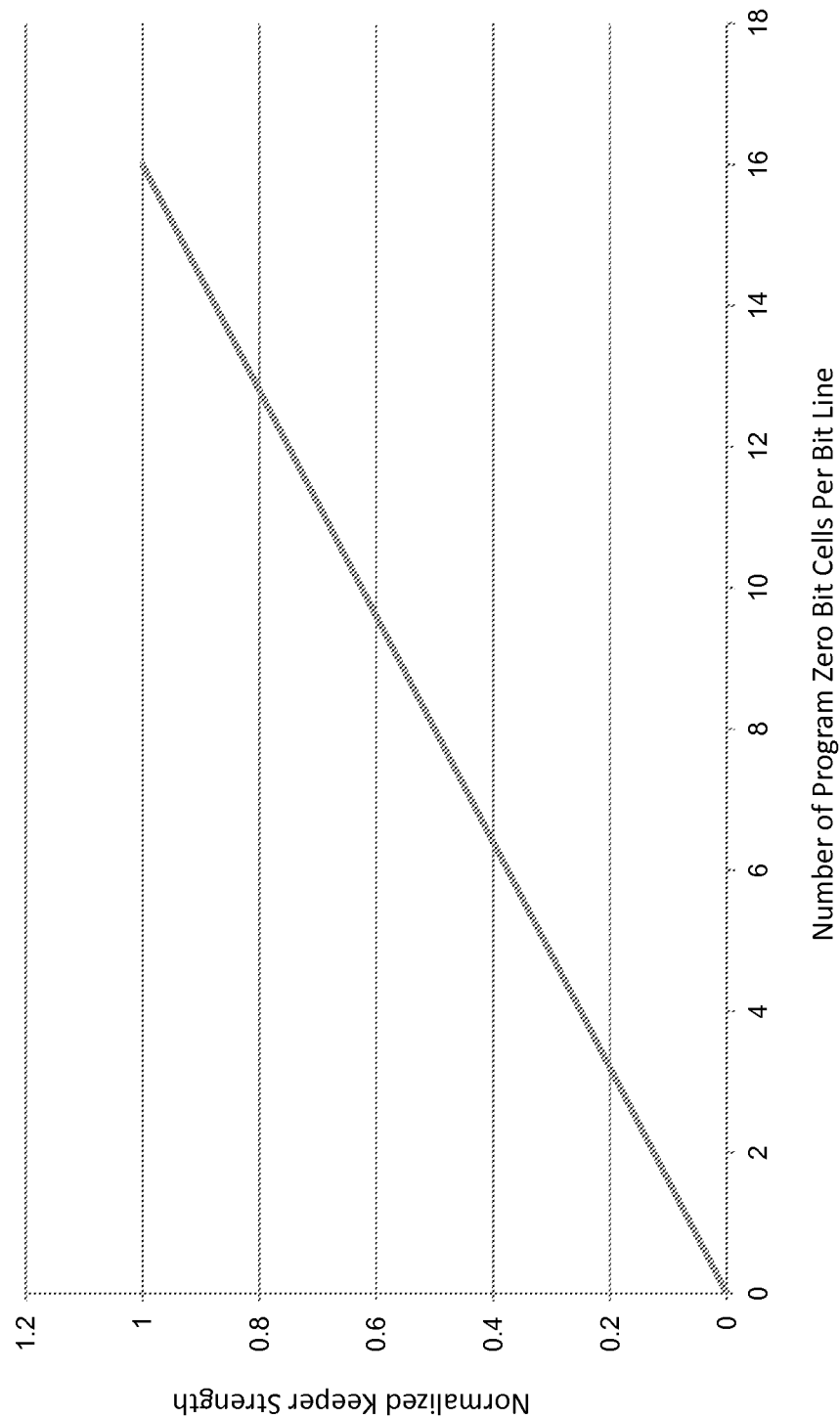
FIG. 4 is a graph of normalized keeper strength versus the number of programmed zero bit cells per bit line.

The first and second optimized bit cells may be used to determine a normalized bit cell strength. FIG. 4 is a graph of one example of normalized keeper strength versus a number of program zero cells per bit line. As shown in FIG. 4, the slope of the graph is a linear one, which enables the size of the keeper cells for each of the other conditions to be extracted and determined. For example, keeper cells may be designed for BLs to which at least one programmed zero bit cell 102 and at least one programmed one bit cell 104 are coupled, to which at least two programmed zero bit cells 102 and at least two programmed bit cells 104 are coupled, etc. Each of the optimized keeper cells may be stored in cell 332a in a non-transient computer readable storage medium 330, 340.

Referring again to FIG. 2, the layout of the semiconductor memory array with the optimized keeper circuits 110 for each of the BLs is stored in a non-transient machine readable storage medium, e.g., storage mediums 330, 340, at block 208. The layout may be stored as a GDSII file as will be understood by one skilled in the art.

At block 210, the GDSII file 242 is used by mask making equipment, such as an optical pattern generator, to generate a mask for the semiconductor memory array including the optimized keeper cells 110. At block 212, router 220 may fabricate the semiconductor memory array including the optimized keeper cells 110 on a semiconductor wafer as will be understood by one skilled in the art.

The methods described above may be at least partially embodied in the form of computer-implemented processes and apparatus for practicing those processes. The present methods may also be at least partially embodied in the form of computer program code embodied in tangible, non-transient machine-readable storage media, such as RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may be embodied at least partially in the form of computer program code, whether loaded into and/or executed by a computer, such that, when the computer program code is loaded into and executed by a computer, the computer becomes an apparatus for practicing the method. When implemented on a general-purpose processor, the computer program code segments configure the processor to create specific logic circuits. The methods may alternatively be at least partially embodied in a digital signal processor formed of application specific integrated circuits for performing a method according to the principles disclosed herein.

In some embodiments, a method includes receiving a memory code identifying a number of logic zeroes and logic ones to be stored in a semiconductor memory, determining a number of bit cells of a first type that are to be coupled to a first bit line of the semiconductor memory from the memory code, and selecting a first keeper circuit from a plurality of keeper circuits based on the number of bit cells of the first type that are to be coupled to the first bit line. An electronic representation of a layout of the semiconductor memory is stored in a non-volatile machine readable storage medium.

In some embodiments, a semiconductor memory includes first and second bit lines. A first number of bit cells of a first type are connected to the first bit line. A first keeper circuit is coupled to the first bit line. The first keeper circuit has a first size that is based on the first number of bit cells of the first type. A second number of bit cells of the first type are connected to the second bit line. A second keeper circuit is coupled to the second bit line. The second keeper circuit has a second size that is based on the second number of bit cells. The first and second sizes are different if the first and second numbers of bit cells are not equal.

In some embodiments, a non-transient machine readable storage medium is encoded with program code, wherein when the program code is executed by a processor, the processor performs a method. The method includes receiving a memory code identifying a number of logic zeroes and logic ones to be stored in a semiconductor memory, determining a number of bit cells of a first type that are to be coupled to a first bit line of the semiconductor memory from the memory code, and selecting a first keeper circuit from a plurality of keeper circuits based on the number of bit cells of the first type that are to be coupled to the first bit line.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method, comprising:
receiving a memory code identifying a number of logic zeroes and logic ones to be stored in a semiconductor memory;
determining a number of bit cells of a first type that are to be coupled to a first bit line of the semiconductor memory from the memory code;
selecting a first keeper circuit from a plurality of keeper circuits based on the number of bit cells of the first type that are to be coupled to the first bit line; and
storing an electronic representation of a layout of the semiconductor memory in a non-volatile machine readable storage medium.

2. The method of claim 1, further comprising:
determining a number of bit cells of the first type that are to be coupled to a second bit line of the semiconductor memory from the memory code; and
selecting a second keeper circuit from a plurality of keeper circuits based on the number of bit cells of the first type that are to be coupled to the second bit line, where the second keeper circuit and the first keeper circuit are different from each other.

3. The method of claim 2, wherein the bit cells of the first type are bit cells programmed to output a logic zero during a read operation, the number of the bit cells of the first type that are to be coupled to the first bit line is greater than the number of the bit cells of the first type that are to be coupled to the second bit line, and a size of the keeper that is to be coupled to the first bit line is smaller than a size of the keeper that is to be coupled to the second bit line.

4. The method of claim 2, wherein the bit cells of the first type are bit cells programmed to output a logic one during a read operation, the number of the bit cells of the first type that are to be coupled to the first bit line is greater than the number of the bit cells of the first type that are to be coupled to the second bit line, and a size of the keeper that is to be coupled to the first bit line is larger than a size of the keeper that is to be coupled to the second bit line.

5. The method of claim 1, further comprising:
determining a number of bit cells of the first type that are to be coupled to each of a plurality of bit lines of the semiconductor memory from the memory code; and
selecting keeper circuits for each of the plurality of bit lines based on the number of bit cells of the first type that are to be coupled to each of the respective bit lines, wherein at least two different types of keeper circuits are selected.

6. The method of claim 1, further comprising:
creating a mask for the semiconductor memory based on the layout; and
fabricating the semiconductor memory using the mask.

7. A semiconductor memory, comprising:
first and second bit lines;
a first number of bit cells of a first type connected to the first bit line;
a first keeper circuit coupled to the first bit line, the first keeper circuit having a first size that is based on the first number of bit cells of the first type;
a second number of bit cells of the first type connected to the second bit line; and
a second keeper circuit coupled to the second bit line, the second keeper circuit having a second size that is based on the second number of bit cells, wherein the first size is different from the second size, and wherein the bit cells of the first type are configured to output a logic zero during a read operation.

8. The semiconductor memory of claim 7, further comprising a second number of bit cells of a second type connected to the first bit line.

9. The semiconductor memory of claim 8, wherein the bit cells of the second type are configured to output a logic one during a read operation.

10. The semiconductor memory of claim 7, wherein the first number of bit cells of the first type is greater than the second number of bit cells of the second type, and a size of the first keeper circuit is smaller than a size of the second keeper circuit.

11. A non-transient machine readable storage medium encoded with program code, wherein when the program code is executed by a processor, the processor performs a method, the method comprising:
 receiving a memory code identifying a number of logic zeroes and logic ones to be stored in a semiconductor memory;
 determining a number of bit cells of a first type that are to be coupled to a first bit line of the semiconductor memory from the memory code; and
 selecting a first keeper circuit from a plurality of keeper circuits based on the number of bit cells of the first type that are to be coupled to the first bit line.

12. The non-transient machine readable medium of claim 11, wherein the method includes
 determining a number of bit cells of the first type that are to be coupled to a second bit line of the semiconductor memory from the memory code; and
 selecting a second keeper circuit from a plurality of keeper circuits based on the number of bit cells of the first type that are to be coupled to the second bit line.

13. The non-transient machine readable storage medium of claim 12, wherein the bit cells of the first type are bit cells programmed to output a logic zero during a read operation, the number of the bit cells of the first type that are to be coupled to the first bit line is greater than the number of the bit cells of the first type that are to be coupled to the second bit line, and a size of the keeper that is to be coupled to the first bit line is smaller than a size of the keeper that is to be coupled to the second bit line.

14. The non-transient machine readable storage medium of claim 12, wherein the bit cells of the first type are bit cells programmed to output a logic one during a read operation, the number of the bit cells of the first type that are to be coupled to the first bit line is greater than the number of the bit cells of the first type that are to be coupled to the second bit line, and a size of the keeper that is to be coupled to the first bit line is larger than a size of the keeper that is to be coupled to the second bit line.

15. The non-transient machine readable storage medium of claim 11, wherein the method includes:
 determining a number of bit cells of the first type that are to be coupled to each of a plurality of bit lines of the semiconductor memory from the memory code; and
 selecting keeper circuits for each of the plurality of bit lines based on the number of bit cells of the first type that are to be coupled to each of the respective bit lines.

16. A semiconductor memory, comprising:
 first and second bit lines;
 a first number of bit cells of a first type connected to the first bit line;
 a first keeper circuit coupled to the first bit line, the first keeper circuit having a first size that is based on the first number of bit cells of the first type;
 a second number of bit cells of the first type connected to the second bit line; and
 a second keeper circuit coupled to the second bit line, the second keeper circuit having a second size that is based on the second number of bit cells,
 wherein the first size is different from the second size, and wherein the bit cells of the first type are configured to output a logic one during a read operation.

17. The semiconductor memory of claim 16, wherein the first number of bit cells of the first type is less than the second number of bit cells of the second type, and a size of the first keeper circuit is greater than a size of the second keeper circuit.

18. The semiconductor memory of claim 16, further comprising a second number of bit cells of a second type connected to the first bit line.

19. The semiconductor memory of claim 18, wherein the bit cells of the second type are configured to output a logic zero during a read operation.

* * * * *